United States Patent [19]

Inpyn

[11] Patent Number: 5,122,925
[45] Date of Patent: Jun. 16, 1992

[54] PACKAGE FOR ELECTRONIC COMPONENTS

[75] Inventor: Carl A. Inpyn, Kinnelon, N.J.

[73] Assignee: Control Products, Inc., East Hanover, N.J.

[21] Appl. No.: 688,847

[22] Filed: Apr. 22, 1991

[51] Int. Cl.$^5$ .............................................. H05K 7/20
[52] U.S. Cl. .................................. 361/386; 361/394; 361/395
[58] Field of Search ................. 200/289; 361/380, 386, 361/388, 392, 394, 395, 399

[56] References Cited

U.S. PATENT DOCUMENTS

| 4,803,590 | 2/1989 | Fassel et al. | 361/386 |
| 4,843,520 | 6/1989 | Nakatani et al. | 361/386 |
| 4,858,071 | 8/1989 | Manabe et al. | 361/386 |

*Primary Examiner*—Gregory D. Thompson
*Attorney, Agent, or Firm*—Michael B. Einschlag

[57] ABSTRACT

Package for electronic components of a switch, which switch includes sensing components such as thermistor, measuring components, and output-control components, some of which components are relatively highly power-dissipative. A first portion of the switch supports the thermistor in a bushing wherein the head of the thermistor is bonded to the bushing with an electrically insulating material and the head of the thermistor is bonded to a wall of the package with a thermally conductive material, all of which bonding provides shock and vibration protection for the thermistor. Heat is removed from the highly power-dissipative components by a thermally conductive material which conducts heat from the components to a surrounding capsule and by wires which connect the switch to outside circuit components.

9 Claims, 5 Drawing Sheets

PACKAGE FOR ELECTRONIC COMPONENTS

TECHNICAL FIELD OF THE INVENTION

The present invention pertains to a package for electronic components of a switch.

BACKGROUND OF THE INVENTION

A thermal switch connects or disconnects an electrical load in response to a temperature sensed by the switch. In a typical thermo-mechanical switch found in the prior art, the switching function is performed by electrical contacts that are caused to operate as a consequence of movement of mechanical members, which mechanical members move in response to the temperature being sensed. In such a typical prior art thermo-mechanical switch, the movement of mechanical members is obtained by using a bimetal cantilever beam, a bimetal disc, paraffin, a contained fluid, a rod in a tube, or many other mechanisms that produce a motive force of a member as a consequence of thermal expansion characteristics of materials or as a consequence of differences in the thermal expansion characteristics of materials.

FIG. 1 shows thermo-mechanical switch 100 which is the type of switch described above. Mechanical moving members are contained in temperature-sensing probe 110 which is disposed in hostile environment 160 and remaining portions 120 of switch 100, including connections to an electrical load being controlled (not shown), remain in a more benign environment behind bulkhead 150.

Thermal switching can be performed without recourse to thermo-mechanical means by using electronic circuitry. For example, it is well known to those of ordinary skill in the art that thermistors can be utilized to sense temperature and that electronic components can be utilized to control switching. However, electronic components generally have temperature limitations. For example, most electronic components that are commonly available for use in designing circuits can only operate at temperatures below 125° C. Further, even though many commonly available electronic components can operate at temperatures at about 125° C., only a few electronic components can operate at temperatures at about 150° C. These facts pose serious technical problems in utilizing electronic circuits to fabricate bulkhead-mounted thermal switches. Further, this problem is compounded by the need to dissipate power in the output components of the switch as the electrical load being switched increases in current rating.

A further, but separate, problem that is encountered in designing electronic, thermal switches relates to a desire to have a switch that responses rapidly to changes in temperature, which desire is satisfied by utilizing electronic, temperature-sensing components having small thermal capacity. The problem arises as a consequence of the fact that devices which are small enough to provide a minimum response time are frequently too fragile structurally for easy application in a bulkhead-mounted thermal switch.

A still further problem that is encountered in designing electronic, thermal switches is the problem of providing isolation from electrical noise and temperature stress for electronic measuring circuitry that is sensitive thereto. In particular, the need to include output-power switching circuits in the same package as temperature-measuring circuits imposes a severe isolation requirement on a design. This problem is further complicated by a desire to have the package retain a cylindrical form which is typical of bulkhead-mounted thermal switch packages.

Lastly, a yet still further problem that is encountered in designing electronic, thermal switches arises as a consequence of a need to obtain maximum thermal conductivity between an environment that is being monitored for temperature and electronic, temperature-sensing components while providing maximum electrical isolation of the electronic, temperature-sensing components from the thermal switch package. Maximum thermal conductivity is required to avoid creating a thermal gradient between the environment that is being monitored and the temperature-sensing components. This is required because any such temperature gradient would cause the switch operation to be inaccurate. Further, electrical isolation is required because changes in the measuring circuit as a result of current leakage through packaging materials could seriously affect thermal switch performance and this is especially important if such current leakage changed with time.

As a result of the above, there is a need in the art for a package for electronic components in a switch which dissipates power, provides mechanical protection from shock and vibration, provides isolation between sensing circuits and power switching circuits, provides connectivity between sensing circuits and the environment, and provides electrical isolation between sensing circuits components and the packaging. In particular, there is a need in the art for such packaging for use in fabricating a thermal switch, which packaging dissipates power so that generally available electronic components can be used to design such a switch, which packaging provides mechanical protection from shock and vibration, which packaging provides isolation between temperature sensing circuits and power switching circuits, provides thermal conductivity between temperature-sensing circuits and the environment, and which packaging provides electrical isolation between temperature-sensing circuits and the packaging.

SUMMARY OF THE INVENTION

Embodiments of the present invention advantageously provide a package which dissipates power, provides mechanical protection from shock and vibration, provides isolation between sensing circuits and power switching circuits, provides connectivity between sensing circuits and the environment, and provides electrical isolation between sensing circuits components and the packaging. In particular, embodiments of the present invention provide packaging for use in fabricating a thermal switch, which packaging dissipates power so that generally available electronic components can be used to design such a switch, which packaging provides mechanical protection from shock and vibration, which packaging provides isolation between temperature sensing circuits and power switching circuits, provides thermal conductivity between temperature-sensing circuits and the environment, and which packaging provides electrical isolation between temperature-sensing circuits and the packaging.

In particular, an embodiment of the present invention is a package for electronic components of a switch, for example, a thermal switch, comprised of sensing components such as, for example, a thermistor, measuring components, and output-control components, some of which components are relatively highly power-dissipative. Specifically, an inventive package comprises: first packing means for supporting the sensing components in a first portion of the switch, the first packing means comprising: (a) means for isolating the sensing components electrically from an environment in which the first packing means is disposed and (b) means for conducting at least one physical property which is descriptive of the environment to the sensing components, the means for isolating and the means for conducting further providing shock and vibration protection for the sensing components; second packing means for supporting and separating the measuring components and the output-control components so that they are protected from electrical or thermal interference or interaction; and third packing means for supporting the highly power-dissipative components, the third packing comprising: (a) means for isolating the highly power dissipative components electrically from an environment in which the third packing means is disposed; and (b) means for dissipating heat generated by the highly power-dissipative components wherein heat from the components is conducted to a surrounding capsule and to conductors which connect the switch to outside circuit components.

BRIEF DESCRIPTION OF THE DRAWING

A complete understanding of the present invention may be gained by considering the following detailed description in conjunction with the accompanying drawing, in which.

DETAILED DESCRIPTION

Figure 1:
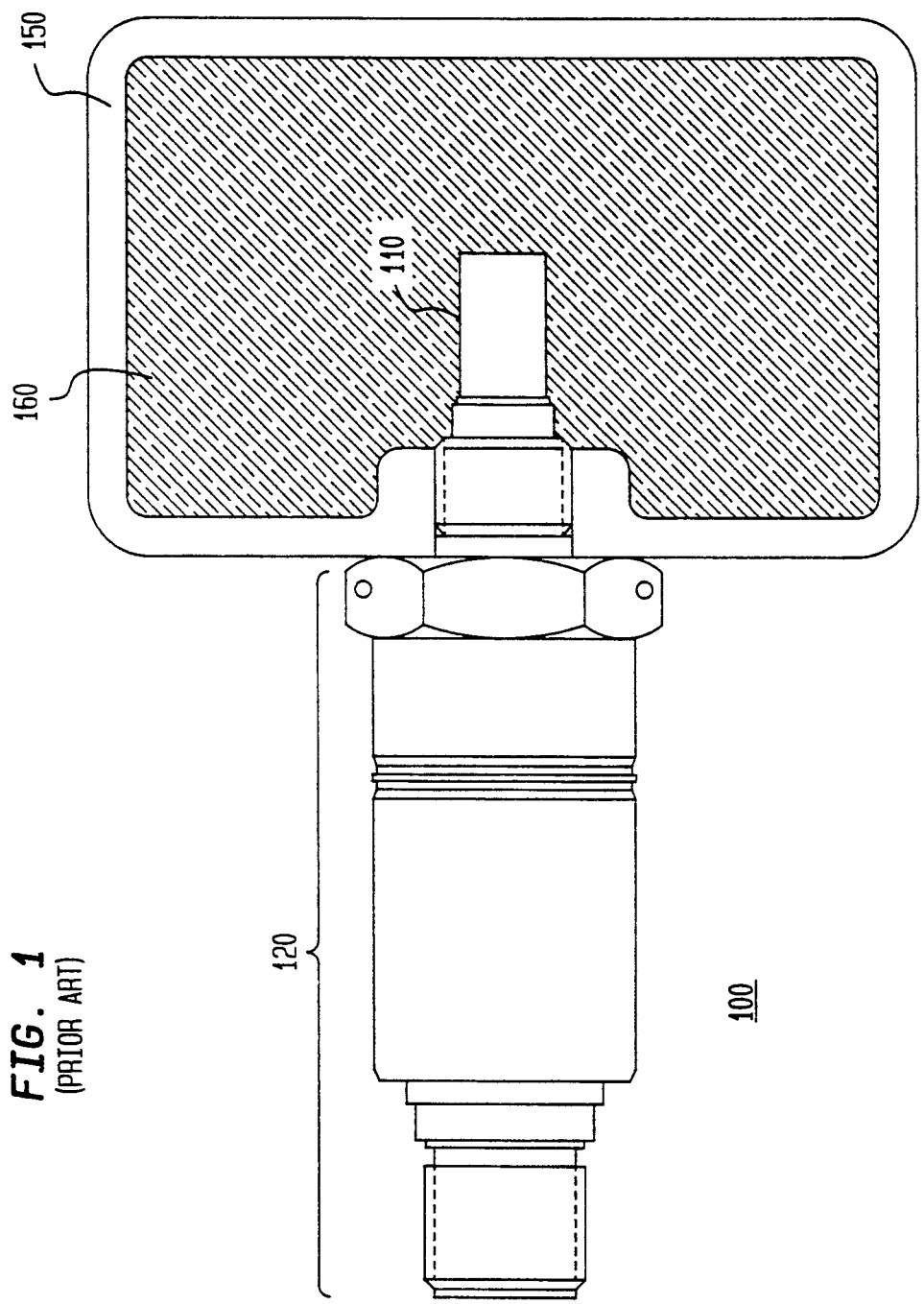
FIG. 1 shows, in pictorial form, the packaging of a bulkhead-mounted, thermo-mechanical switch.
Figure 2:
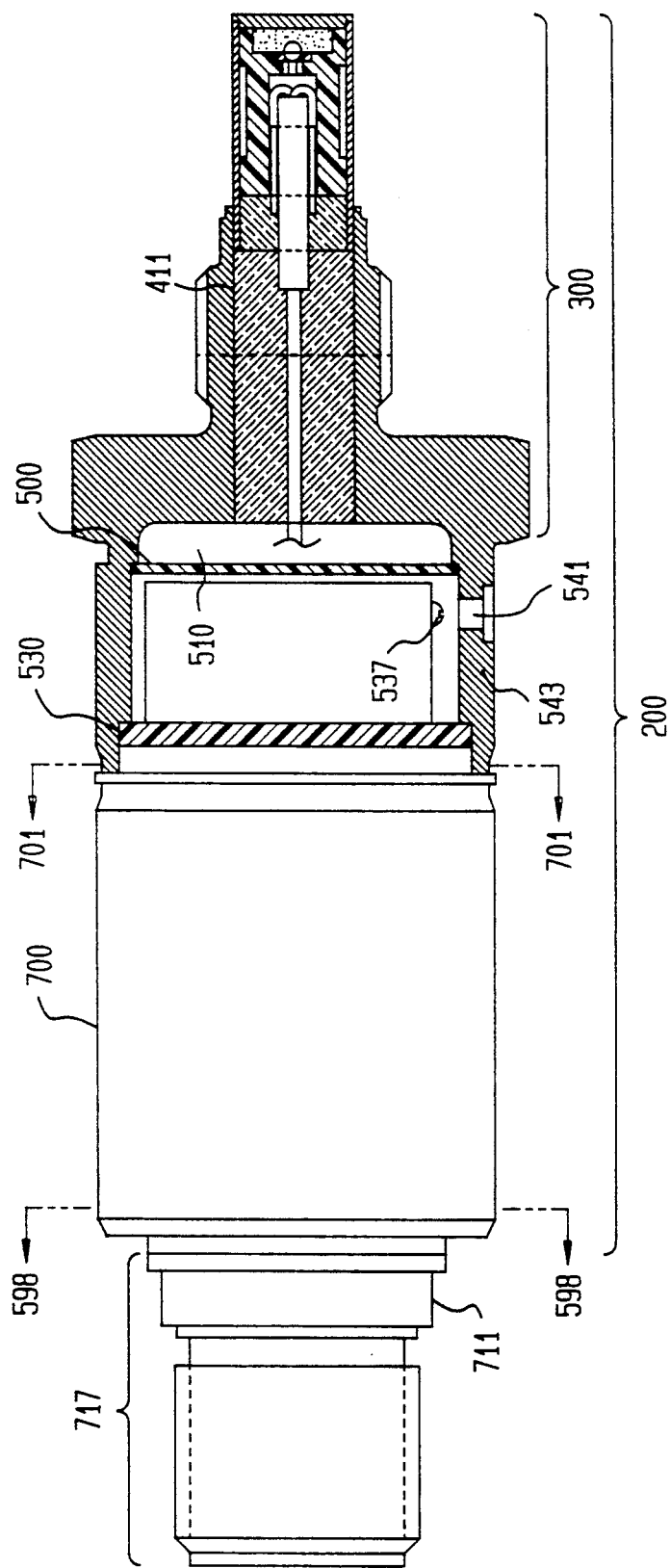
FIG. 2 shows a thermal switch which comprises packaging fabricated in accordance with the present invention and includes a cross-section of a temperature-sensing probe thereof.

FIG. 2 shows electronic, thermal switch 200 and includes a cross-section of temperature-sensing probe 300 thereof. Electronic thermal switch 200 comprises a preferred embodiment of packaging which is fabricated in accordance with the present invention.

Figure 3:
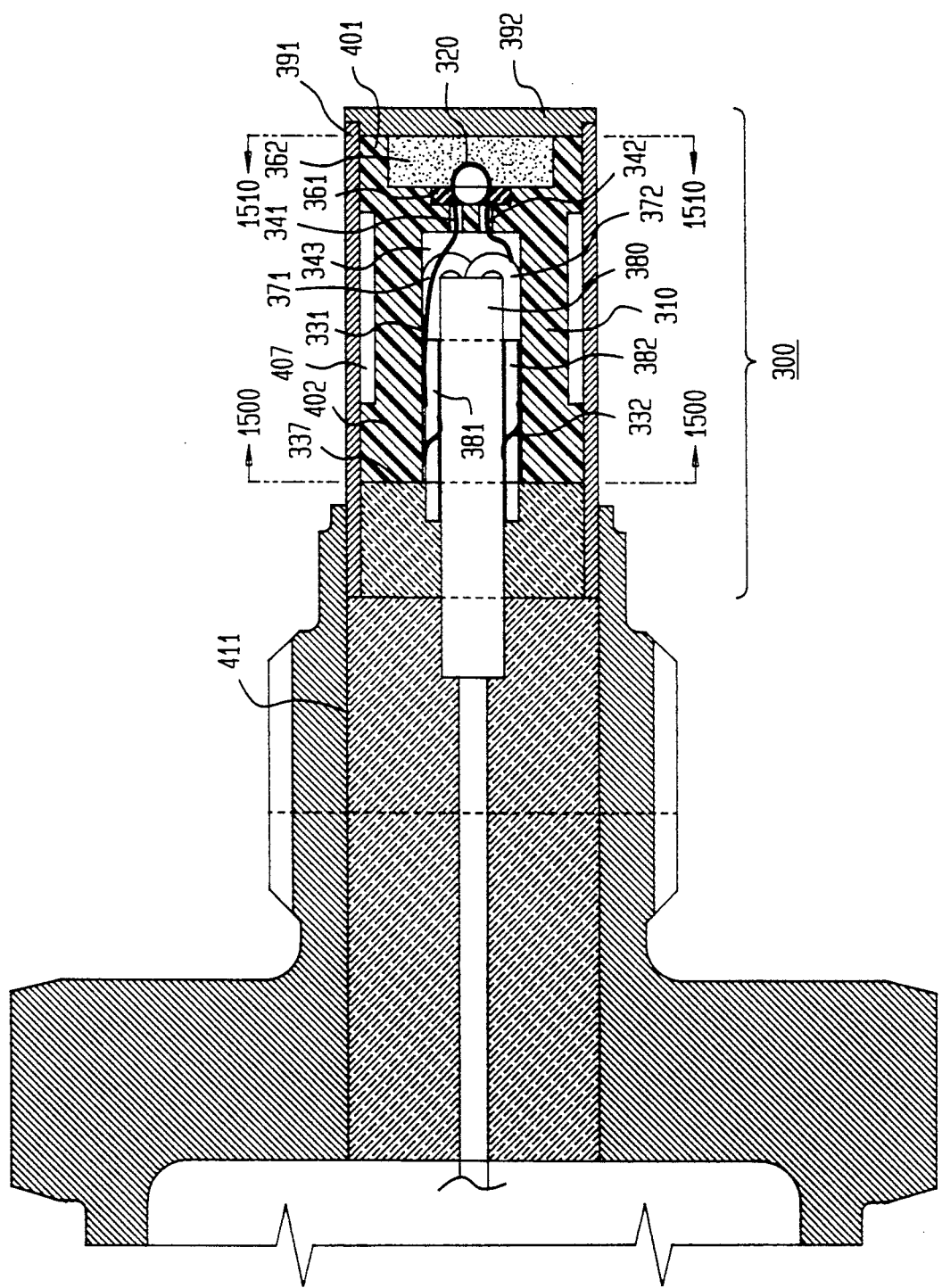
FIG. 3 shows, in pictorial form, a cross-section of a temperature sensing probe of the thermal switch shown in FIG. 2.

FIG. 3 shows an enlarged cross-section of temperature-sensing probe 300 of electronic thermal switch 200.

As shown in FIG. 3, temperature-sensing probe 300 comprises thermistor 320 which is mounted in thermistor mounting bushing 310. Thermistor mounting bushing 310 provides structural support for glass thermistor bead 320 and fragile thermistor lead wires 331 and 332 during and after assembly into the end of probe assembly 300 —note that lead wires 331 and 332 can be as small as AWG 38 gauge. Bushing 310 is formed of a plastic material which is thermally and electrically insulating and which can resist the temperatures which exist in an environment in which probe 300 is disposed. A cup is formed at the front end of thermistor mounting bushing 310 and two small holes 341 and 342 traverse bushing 310 and exit into axial shaft 343 that extends to the opposite end of bushing 310, i.e., end 337.

Figure 4:
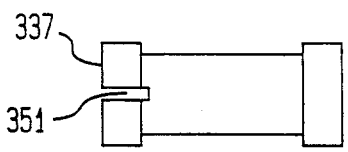
FIG. 4 shows a top view of a thermistor mounting bushing of the thermal switch shown in FIG. 2.
Figure 5:
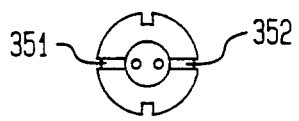
FIG. 5 shows a view of a first end of the thermistor mounting bushing of the thermal switch shown in FIG. 2.

FIG. 4 shows a top view of bushing 310 which is rotated from the cross-section shown in FIG. 3 and FIG. 5 shows an end view of bushing 310 along the direction of arrows 1500. At end 337 of bushing 310, two longitudinal slots 351 and 352 extend approximately one-third of the length of bushing 310 from end 337. As will be explained in detail below, longitudinal slots 351 and 352 serve to protect fragile wires 331 and 332 when switch 200 is assembled.

The following describes the manner in which thermal probe 300 is assembled and, in doing so, provides a detailed explanation of the various components thereof.

During assembly of switch 200, thermistor lead wires 331 and 332 are threaded through small holes 341 and 342, respectively, and a glass bead which comprises thermistor 320 is pressed snugly against bushing 310 in the cup formed by cylindrical shafts 361 and 362, respectively. Then, thermistor lead wires 331 and 332 are bent up through side slots 351 and 352 of mounting bushing 310 so that the leads stick out at substantially 90 degrees to the longitudinal axis of bushing 310.

Figure 6:
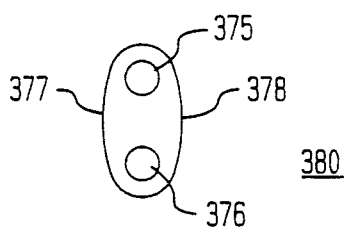
FIG. 6 shows an end view of a ceramic insulator of the thermal switch shown in FIG. 2.

Assembly continues as two stripped, insulated wires 371 and 372 are inserted into longitudinal shafts 375 and 376 through ceramic insulator 380—FIG. 6 provides an end view of ceramic insulator 380 taken in the direction shown by arrows 1510 of FIG. 3, which FIG. 6 shows shafts 375 and 376 and flat sides 377 and 378. Assembly further continues as stripped ends 381 and 382 of wires 371 and 372, respectively, are bent back against flat sides 377 and 378 of ceramic insulator 380, one wire on each side of ceramic insulator 380. Assembly still further continues as an end of a group formed of ceramic insulator 380 and wires 371 and 372 is inserted into axial shaft 34 in thermistor mounting bushing 310 so that portions of wires 371 and 372 which are disposed against flat sides 377 and 378, respectively, of ceramic insulator 380 are disposed adjacent to longitudinal bushing slots 351 and 352. After the group formed of ceramic insulator 380 and wires 371 and 372 is fully inserted into axial shaft 343 of bushing 310, wires 371 and 372 are bent outward through slots 351 and 352, respectively, so that wire 371 is adjacent to thermistor lead wire 331 and wire 372 is adjacent to thermistor lead wire 332. Fragile thermistor lead wires 331 and 332 are then wrapped around stripped ends 381 and 382, respectively, of sturdy lead wires 371 and 372 and joined by, for example, being soldered with high temperature solder, spot welded, or ultrasonically welded, depending on the temperature requirements of the particular application in which electronic thermal switch 200 is to be used. The joined wires are then pressed back through slots 351 and 352 so that they are disposed up against flat sides 377 and 378 of ceramic insulator 380. A drop of adhesive may be applied between ceramic insulator 380 and the wall of axial shaft 343 in thermistor mounting bushing 310 to prevent rotation.

As one can readily appreciate, the above-described method of construction of the structure for mounting thermistor 320, as well as the structure itself, maintain fragile thermistor lead wires 331 and 332 in an unstressed condition at the point at which they enter glass bead 320 and prevent them from breaking off during assembly.

In the next step of the assembly of switch 200, cylindrical shafts 361 and 362 which form a cup in which thermistor head 320 is disposed are filled with epoxy. In particular, shaft 361 is filled with an epoxy which is electrically insulating. Then, the epoxy in shaft 361 and the adhesive that was placed in axial shaft 343 are cured to prevent ceramic insulator 380 from moving during the assembly. Then, shaft 362 is filled with an epoxy which is thermally highly-conductive and stable over a wide temperature range, including very high temperatures, the epoxy in shaft 362 is left uncured for the time being. Lastly, bushing 310 is pushed into cylinder 391 so that the front of bushing 310 presses up against metal plug 392. The epoxy in shaft 361 bonds thermistor bead 320 to bushing 310 and the epoxy in shaft 362 bonds thermistor bead 320 to metal plug 392. As a result, the epoxy in shaft 361 provides structural support for thermistor bead 320 and the epoxy in shaft 362 provides a low thermal resistance path between thermistor bead 320 and the inside surface of metal plug 392.

Figure 7:
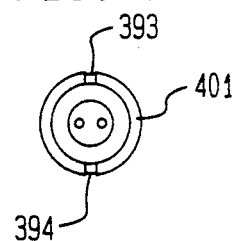
FIG. 7 shows a view of a second end of the thermistor mounting bushing of the thermal switch shown in FIG. 2.
Figure 8:
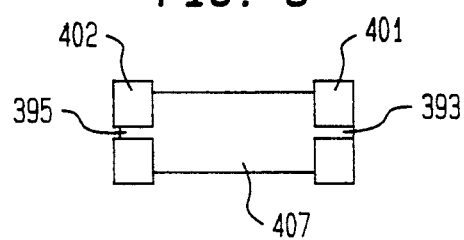
FIG. 8 shows a top view of the thermistor mounting bushing of the thermal switch shown in FIG. 2 which is rotated from the view shown in FIG. 4.

FIG. 7 provides an end view of bushing 310 along the direction of arrows 1510 and FIG. 8 shows a view of bushing 310 which is rotated from the view of FIG. 4. As shown in FIGS. 3, 7, and 8, mounting bushing 310 is comprised of: (a) channels 393 and 394 in cylindrical ridge 401; (b) cylindrical groove 407 about the middle of bushing 310; and (c) channels 395 and 396 (not shown) in cylindrical ridge 402. These channels and the groove provide a path for excess epoxy and air to escape as mounting bush 310 is pushed into tube 391 and up against metal plug 392.

After thermistor mounting bushing 310 is snugly pressed against metal plug 392, the thermally conductive epoxy in shaft 362 is cured. Then, the end of tube 391 which is opposite plug 392 is filled with silicone sealant 411 potting material that: (a) has high electrical resistivity; (b) is stable over a wide temperature range; and (c) is stable at high temperatures. Silicone sealant 411 provides support for thermistor mounting bushing 310, ceramic insulator 380, and lead wires 371 and 372 that are joined to thermistor lead wires 331 and 332, respectively. In a preferred embodiment of the present invention, silicone sealant 411 is the same material that is used to fill shaft 361. Silicone sealant 411 is then cured.

The above-described structure provides an assembly that is immune to severe shock and vibration, despite the fragility of thermistor lead wires 331 and 332 and the encapsulation structure. As a result, one can design thermal switches that take advantage of the small thermal mass of thermistor 320 to obtain a rapid switch response.

As shown in FIG. 2, barrier plate 500 is an insulating barrier which provides thermal insulation between temperature-sensing probe 300, which is typically disposed in an environment having a hostile temperature, and the remaining body of electronic thermal switch 200, which is typically disposed in an environment having a more benign temperature. Barrier plate 500 is typically formed of plastic and traps a pocket of air in chamber 510 which is formed between itself and sealant 411. This pocket of air in chamber 510 ensures that the portion of electronic thermal switch 200 which contains electronic components is protected from thermal probe 300 which may be subjected to high temperatures.

Referring to FIG. 2, printed circuit board 530 contains electronic components which form temperature-sensing circuits, temperature measurement circuits, and output switch-control circuits of electronic thermal switch 200. Printed circuit board 530 also holds a trimmer resistor (not shown) with external access for adjustment of screw 537 through aperture 541 in body 543 of switch 200. A trimmer resistor is useful in some applications where it is desirable to adjust a calibration temperature of switch 200 after assembly.

Figure 10:
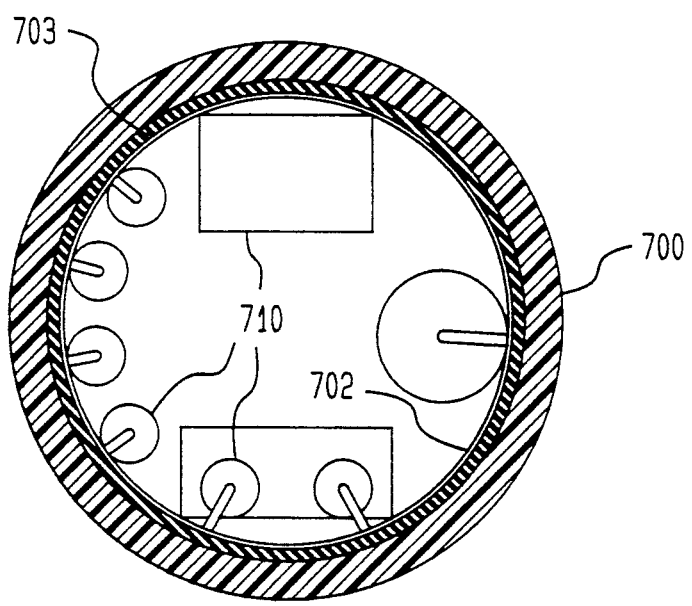
FIG. 10 shows a head-on view of flexible printed circuit board components and insulator along the direction of arrows 701 of FIG. 2.

Referring to FIG. 10 which shows a head-on view of flexible printed circuit board components and insulator along the direction of arrows 701 in FIG. 2, printed circuit board 702 is a flexible printed circuit board that contains most of the power components, like components 710, for electronic thermal switch 200. As shown in FIG. 10, flexible circuit board 702 is wrapped into a tubular form. Components 710 are disposed on the inside of the board and, in assembly, flexible circuit 702 is pushed into insulating sleeve 703 which is disposed within cylindrical body 700 of switch 200. In a preferred embodiment, insulating sleeve 703 is a silicone rubber insulator.

Figure 9:
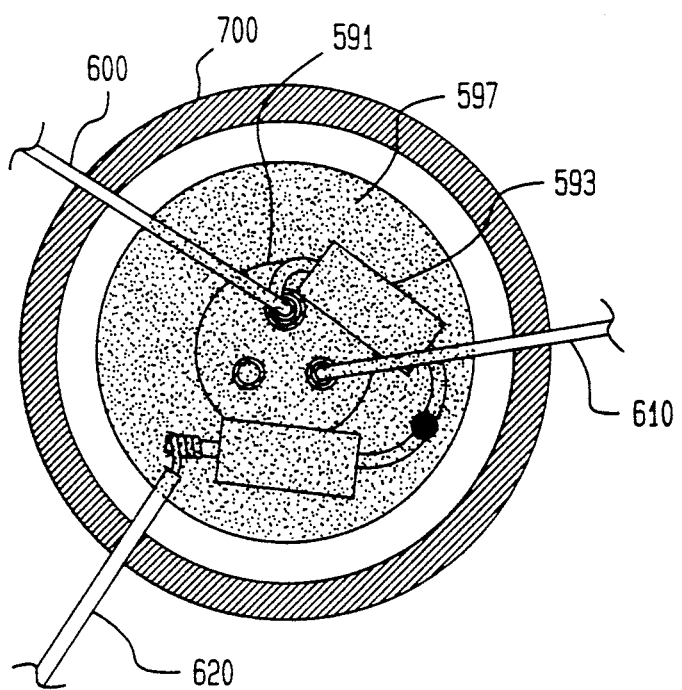
FIG. 9 shows a head-on view of highly power-dissipative components of the thermal switch shown in FIG. 2.

The most highly power-dissipative components in switch 200 are mounted on the inside of switch connector 717, in portion 711. FIG. 9 shows a head-on view along the direction of arrows 598 in FIG. 2. As shown in FIG. 9, highly power-dissipative components 593 are covered with potting material 597. Potting material 597 is: (a) highly-conductive thermally so that it carries heat from circuitry to the wall of connector 717 and (b) insulating electrically—in a preferred embodiment of the present invention potting material 597 is the same material that is used to fill shaft 362. Further, wire 600 is connected to an electrical load (not shown) through the rear of switch 200 by means of connector fixture 591; wire 610 is connected to a power supply return (not shown) through the rear of switch 200 by means of connector fixture 591; and wire 620 is an internal wire for switch 200. As a result, connector 717 and cable wires 600 and 610 which connect to switch 200 act as a heat sink for the most highly power-dissipative components, i.e., components 593, in thermal switch 200. They do this by conducting heat away from other components that might otherwise have their electrical ratings impaired or that might have their electrical values changed by expose to heat to such an extent that the performance of electronic thermal switch 200 is affected. Lastly, in accordance with the present invention, wires having a high-temperature insulation rating are used between: (a) thermistor 320 and printed circuit board 530; (b) printed circuit board 530 and flexible printed circuit board 702; and (c) flexible printed circuit board 702 and connector fixture 591 and power-dissipative components 593 connected thereto.

In a preferred embodiment of the present invention: (a) thermistor mounting bushing 310 is fabricated from high temperature thermoplastic available from General Electric under the name ULTEM; (b) the epoxy in cylindrical shaft 361 and in shaft 343 is commercially available from Master Bond, Inc. as Master-Sil Polymer System 151; (c) the epoxy in cylindrical shaft 362 is commercially available from Master Bond, Inc. as Master Bond Polymer System EP30ANHT; (d) ceramic insulator 380 is commercially available from Coors Ceramic Co. as Catalog No. 65697 Oval Double Bore-Open Both Ends AD-998 Alumina; (e) tube 391 is fabricated from stainless steel; (f) metal plug 392 is fabricated from stainless steel; (g) silicone sealant 411 is commercially available from Master Bond, Inc. as Master-Sil Polymer System 151; (h) barrier plate 500 is G10 glass epoxy board; and (i) potting material 597 is commercially available from Master Bond, Inc. as Master Bond Polymer System EP30ANHT.

Those skilled in the art recognize that further embodiments of the present invention may be made without departing from its teachings. For example, embodiments of the present invention are not restricted to use in a thermal switch and may be used any number of switches which used to switch a load as a function of temperature, of pressure, of time, or of some combination of these or other conditions.

What is claimed is:

1. Package for electronic components of a switch which is connected to outside circuit components by conductors, which switch is comprised of at least one sensing component, sensing and measuring components, output-control components, and power components, some of which components are relatively highly power-dissipative, which package comprises:
   first packing means for supporting the at least one sensing component in a first portion of the switch, the first packing means comprising:
   (a) means for isolating the at least one sensing component electrically from an environment in which the first packing means is disposed; and p2 (b) means for conducting at least one physical property which si descriptive of the environment to the at least on sensing component;
   second packing means for supporting and separating the sensing and measuring components and the output-control components from the power components; and
   third packing means, disposed in a capsule, for supporting the highly power-dissipative components, the third packing comprising:
   means for isolating the highly power dissipative components electrically from an environment in which the third packing means is disposed and for dissipating heat generated by the highly power-dissipative components wherein heat from the components is conducted to the capsule and to the conductors.

2. The package of claim 1 wherein the switch is a thermal switch, the at least one sensing component comprises a temperature sensing component, and the first packing means further comprises a bushing for supporting the temperature sensing component.

3. The package of claim 2 wherein the temperature sensing component comprises a sensing means and wire means and the bushing is comprised of:
   a cup means disposed at a first end of the bushing for supporting the sensing means and
   at least one shaft which extends from the cup means into a longitudinal shaft, which longitudinal shaft extends into the bushing from a second end which is opposite from the first end, which at least one shaft supports the wire means.

4. The package of claim 3 wherein:
   the cup means comprises a first cylindrical shaft and a second cylindrical shaft which extend into the bushing from the first end;
   the means for isolating the at least one sensing component comprises a first material, being disposed in the first shaft, which first material is substantially electrically insulating;
   the means for conducting comprises a second material, being disposed in the second shaft, which second material is substantially thermally conductive; and
   the first material substantially bonding the sensing means against the bushing and the second material substantially bonding the sensing means to an outer wall of the first packing means.

5. The package of claim 4 wherein the bushing comprises slots which extend from the second end towards the first end for use in assembling the switch.

6. The package of claim 5 wherein the first packing means comprises insulating means which is at least partially disposed within the longitudinal shaft of the bushing, which insulating means is comprised of shafts.

7. The package of claim 6 wherein the first packing means comprises a third material disposed at the second end of the bushing, which third material is substantially electrically insulating.

8. The package of claim 7 wherein the third packing means comprises a fourth material which substantially covers the highly power-dissipative components, which fourth material is substantially thermally conductive and substantially electrically insulating.

9. The package of claim 8 wherein the second packing means comprises thermally insulating means disposed to block transmission of heat from the first packing means.

* * * * *